(12) United States Patent
Hung et al.

(10) Patent No.: US 11,864,469 B2
(45) Date of Patent: Jan. 2, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Ching-Wen Hung, Tainan (TW); Ya-Sheng Feng, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/902,895

(22) Filed: Sep. 5, 2022

(65) Prior Publication Data

US 2022/0416154 A1  Dec. 29, 2022

Related U.S. Application Data

(63) Continuation of application No. 16/207,206, filed on Dec. 3, 2018, now Pat. No. 11,469,368.

(30) Foreign Application Priority Data

Oct. 31, 2018  (CN) .......................... 201811286628.7

(51) Int. Cl.
*H10N 50/80* (2023.01)
*H01L 21/768* (2006.01)
*H10N 50/01* (2023.01)

(52) U.S. Cl.
CPC ....... *H10N 50/80* (2023.02); *H01L 21/76801* (2013.01); *H01L 21/76838* (2013.01); *H10N 50/01* (2023.02)

(58) Field of Classification Search
CPC ......... H01L 43/12; H01L 43/08; H01L 43/02; H01L 43/10
See application file for complete search history.

(56) References Cited

U.S. PATENT DOCUMENTS

| | | | |
|---|---|---|---|
| 6,521,931 B2 | 2/2003 | Sandhu et al. | |
| 8,273,582 B2 | 9/2012 | Nozieres | |
| 9,082,956 B2 | 7/2015 | Liu | |
| 9,373,782 B2 | 6/2016 | Li | |
| 2002/0105035 A1 | 8/2002 | Sandhu | |
| 2010/0193888 A1 | 8/2010 | Gu | |
| 2011/0008915 A1 | 1/2011 | Nozieres | |
| 2012/0139069 A1 | 6/2012 | Kim | |
| 2012/0248557 A1* | 10/2012 | Liu ....................... | G11C 11/161 257/E29.323 |
| 2014/0377884 A1 | 12/2014 | Chi | |
| 2015/0188037 A1 | 7/2015 | Nam | |

(Continued)

*Primary Examiner* — Raj R Gupta
(74) *Attorney, Agent, or Firm* — Winston Hsu

(57) ABSTRACT

A method for fabricating semiconductor device includes the steps of: forming a first inter-metal dielectric (IMD) layer on a substrate; forming a metal interconnection in the first IMD layer; forming a bottom electrode layer and a pinned layer on the first IMD layer; forming a sacrificial layer on the pinned layer; patterning the sacrificial layer, the pinned layer, and the bottom electrode layer to form a first magnetic tunneling junction (MTJ); forming a second IMD layer around the first MTJ; removing the sacrificial layer to form a recess; forming a barrier layer and a free layer in the recess; forming a top electrode layer on the free layer; and patterning the top electrode layer and the free layer to form a second MTJ.

5 Claims, 7 Drawing Sheets

(56) References Cited

U.S. PATENT DOCUMENTS

| | | |
|---|---|---|
| 2015/0287909 A1 | 10/2015 | Liu |
| 2016/0111629 A1 | 4/2016 | Toh |
| 2016/0225981 A1 | 8/2016 | Deshpande |
| 2017/0062031 A1* | 3/2017 | Han ............... G11C 11/161 |
| 2017/0141159 A1 | 5/2017 | Kim |
| 2019/0207099 A1 | 7/2019 | Annunziata |
| 2020/0075840 A1 | 3/2020 | Feng |
| 2020/0144387 A1 | 5/2020 | Yang |

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 16/207,206, filed on Dec. 3, 2018. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a first inter-metal dielectric (IMD) layer on a substrate; forming a metal interconnection in the first IMD layer; forming a bottom electrode layer and a pinned layer on the first IMD layer; forming a sacrificial layer on the pinned layer; patterning the sacrificial layer, the pinned layer, and the bottom electrode layer to form a first magnetic tunneling junction (MTJ); forming a second IMD layer around the first MTJ; removing the sacrificial layer to form a recess; forming a barrier layer and a free layer in the recess; forming a top electrode layer on the free layer; and patterning the top electrode layer and the free layer to form a second MTJ.

According to another aspect of the present invention, a semiconductor device includes a magnetic tunneling junction (MTJ) on a substrate having a pinned layer on a bottom electrode layer, a barrier layer on the pinned layer, a free layer on the barrier layer, and a top electrode layer on the free layer, and a spacer around the MTJ. Preferably, the barrier layer is extended to contact a top surface of the spacer, a sidewall of the barrier layer is aligned with a sidewall of the pinned layer, a thickness of the free layer on the pinned layer is greater than a thickness of the free layer on the spacer, and a width of the free layer is greater than a width of the pinned layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
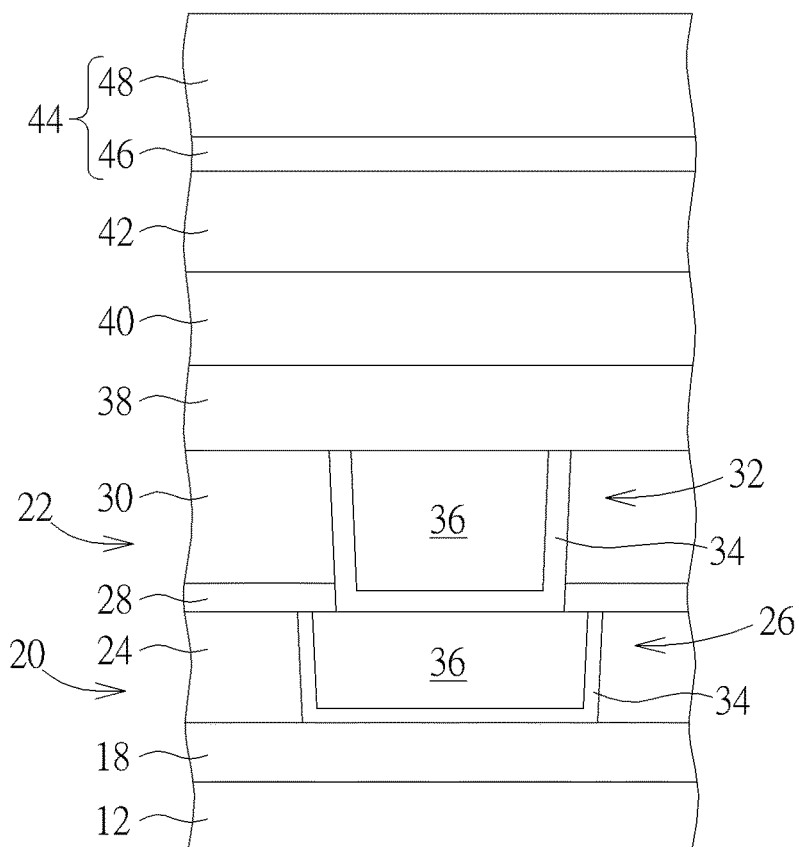
FIGS. 1-9 illustrate a method for fabricating a MRAM device according to an embodiment of the present invention.

Referring to FIGS. 1-9, FIGS. 1-9 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region and a logic region (not shown) are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region and the edge region to electrically connect the aforementioned contact plugs, in which the metal interconnect structure 20 includes an inter-metal dielectric (IMD) layer 24 and metal interconnection 26 embedded in the IMD layer 24, and the metal interconnect structure 22 includes a stop layer 28, an IMD layer 30, and metal interconnection 32 embedded in the stop layer 28 and the IMD layer 30.

In this embodiment, the metal interconnection 26 from the metal interconnect structure 20 preferably includes a trench conductor and the metal interconnection 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode layer 38, a pinned layer 40, a sacrificial layer 42, and a mask layer 44 are formed on the IMD layer 30. In this embodiment, the bottom electrode layer 38 is preferably made of conductive material including but not limited to for example Ta, Pt, Cu, Au, Al, or combination thereof. The pinned layer 40 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 40 is formed to fix or limit the direction of magnetic moment of adjacent layers. The sacrificial layer 42 could include semiconductor or dielectric material including but not limited to for example polysilicon, silicon oxide, or silicon nitride. The mask layer 44 could include a single-layered mask or composite mask having multiple layers. In this embodiment, the mask layer 44 is preferably a dual-layered structure having a mask layer 46 made of silicon nitride disposed on the surface of the sacrificial layer 42 and a mask layer 48 made of silicon oxide disposed on the mask layer 46.

Figure 2:
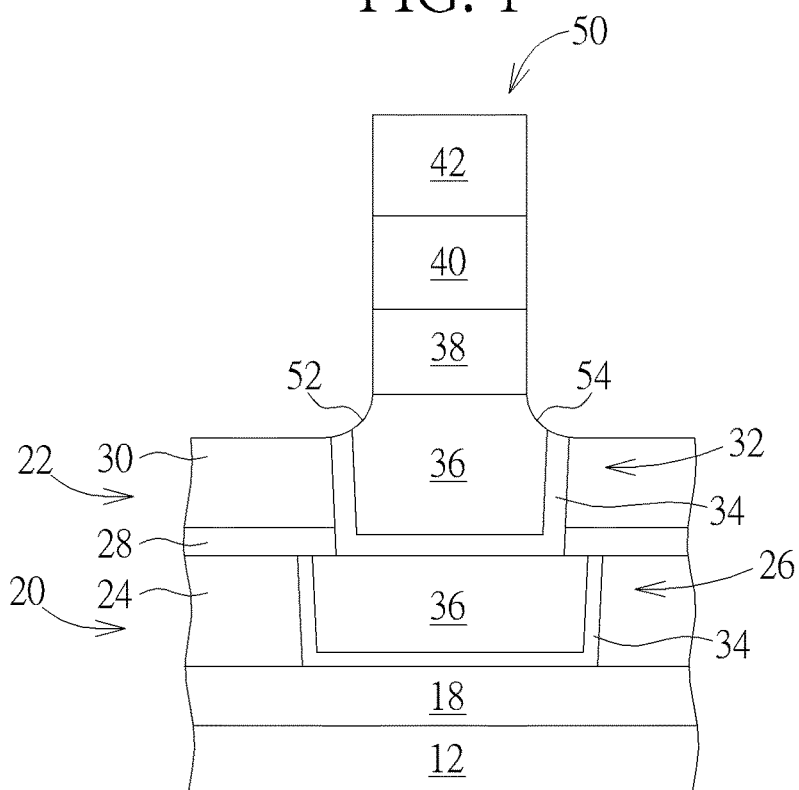

Next, as shown in FIG. 2, a photo-etching process could be conducted by first forming a patterned mask (not shown) made of patterned resist on the mask layer 44, and then using the patterned resist as mask to sequentially remove part of the patterned mask 44, part of the sacrificial layer 42, part of pinned layer 40, and part of the bottom electrode layer 38 to form a magnetic tunneling junction (MTJ) 50. The patterned mask 44 is removed thereafter.

It should be noted that an ion beam etching (IBE) process is preferably conducted to remove part of the sacrificial layer 42, part of the pinned layer 40, part of the bottom electrode layer 38, and part of the IMD layer 30 to form the MTJ 50. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnection 32 is removed at the same time so that a first slanted sidewall 52 and a second slanted sidewall 54 are formed on the metal interconnection 32 adjacent to the MTJ 62, in which each of the first slanted sidewall 52 and the second slanted sidewall 54 could further include a curve (or curved surface) or a planar surface.

Figure 3:
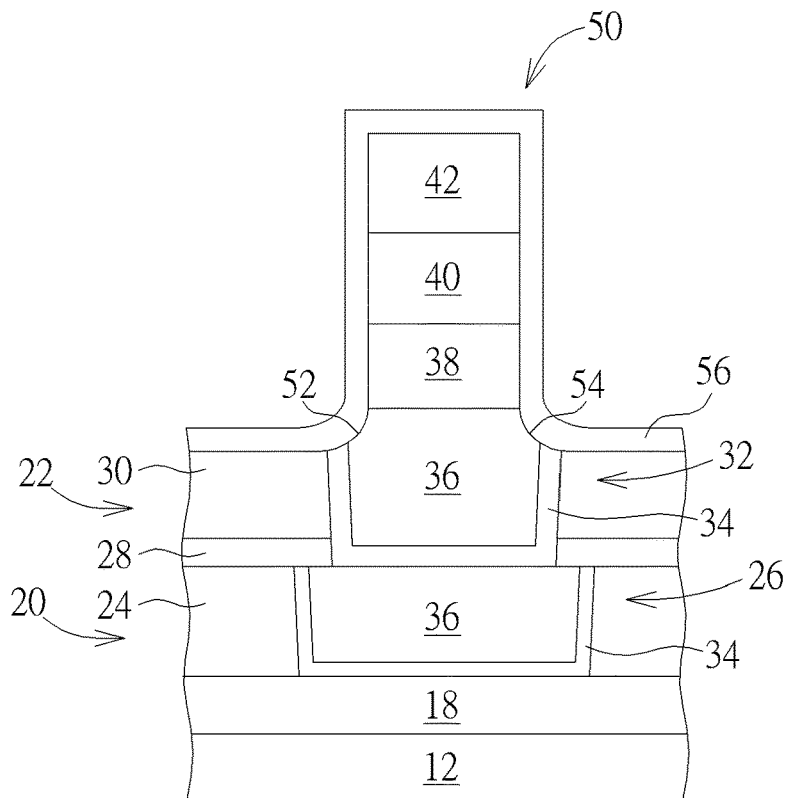

Next, as shown in FIG. 3, a liner 56 is formed on the MTJ 50 to cover the surface of the IMD layer 30. In this embodiment, the liner 56 is preferably made of silicon oxide. Nevertheless, according to other embodiment of the present invention, the liner 56 could also be made of other dielectric material including but not limited to for example silicon oxide, silicon oxynitride (SiON), or silicon carbon nitride (SiCN).

Figure 4:
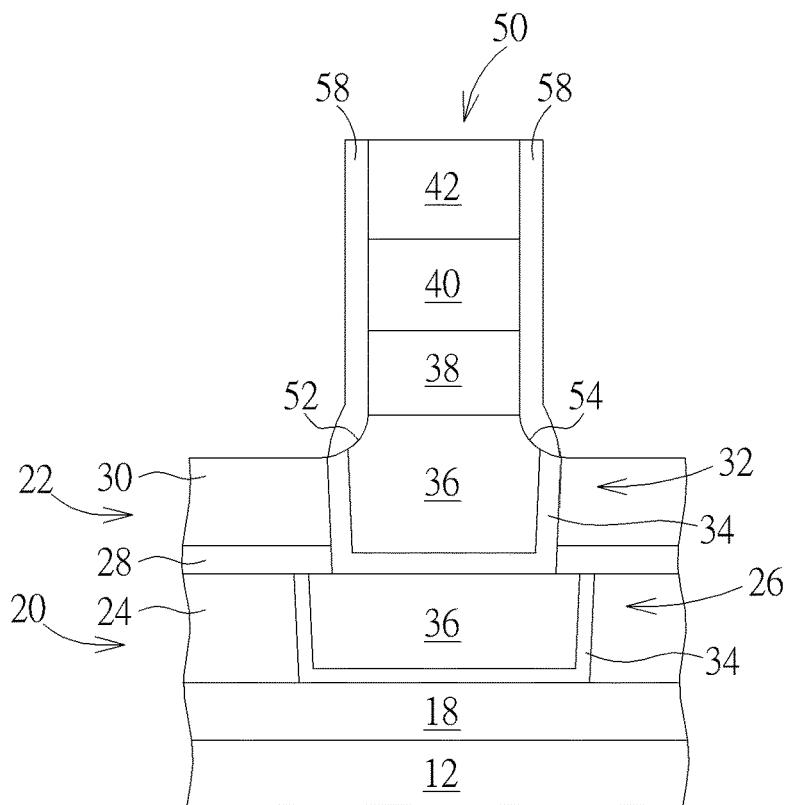

Next, as shown in FIG. 4, an etching process is conducted to remove part of the liner 56 to form a spacer 58 adjacent to the MTJ 50, in which the spacer 58 is disposed to directly contact the sidewalls of the MTJ 50 and covering and directly contacting the first slanted sidewall 52 and second slanted sidewall 54 at the same time. Preferably, the top surface of the spacer 58 is also even with the top surface of the sacrificial layer 42.

Figure 5:
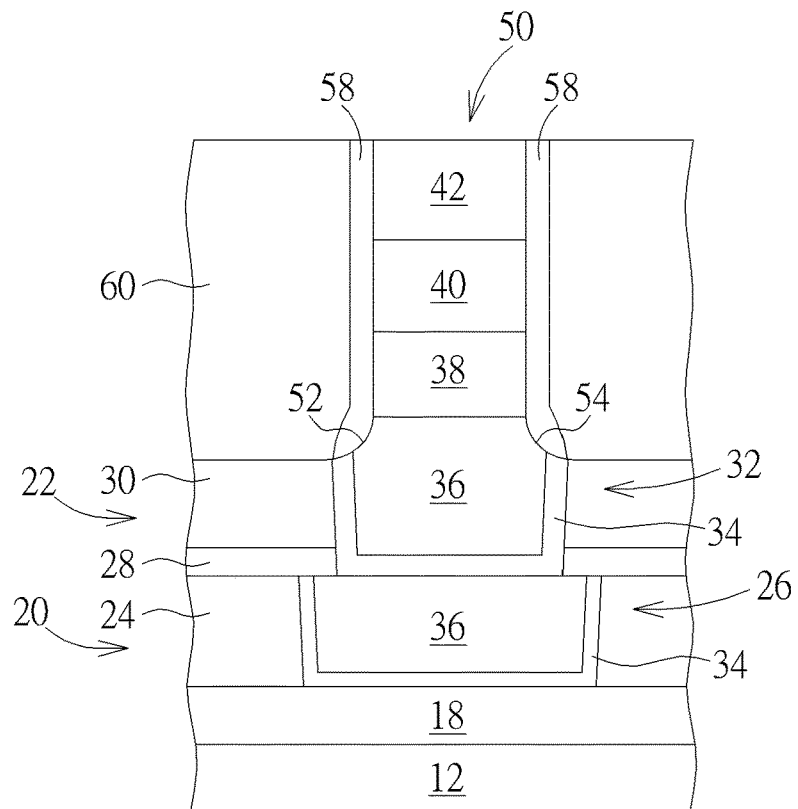

Next, as shown in FIG. 5, another IMD layer 60 is formed on the surface of the IMD layer 30 and covering the MTJ 50, and a planarizing process such as chemical mechanical polishing (CMP) process is conducted so that the top surface of the IMD layer 60 is even with the top surface of the MTJ 50.

Figure 6:
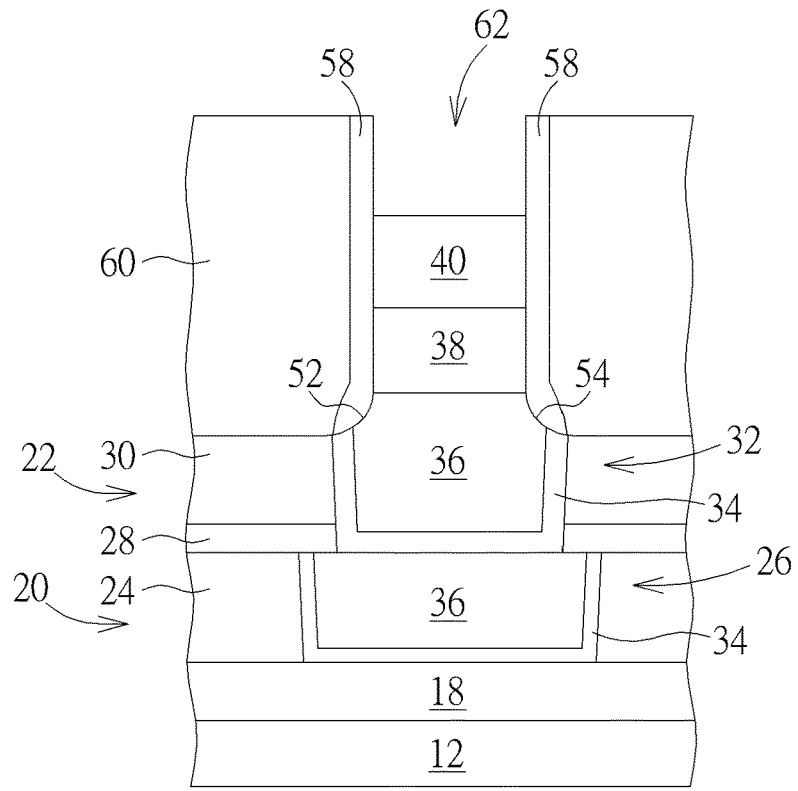

Next, as shown in FIG. 6, an etching process is conducted by using the IMD layer 60 as mask to remove the sacrificial layer 42 to form a recess 62 and expose the pinned layer 40 underneath.

Figure 7:
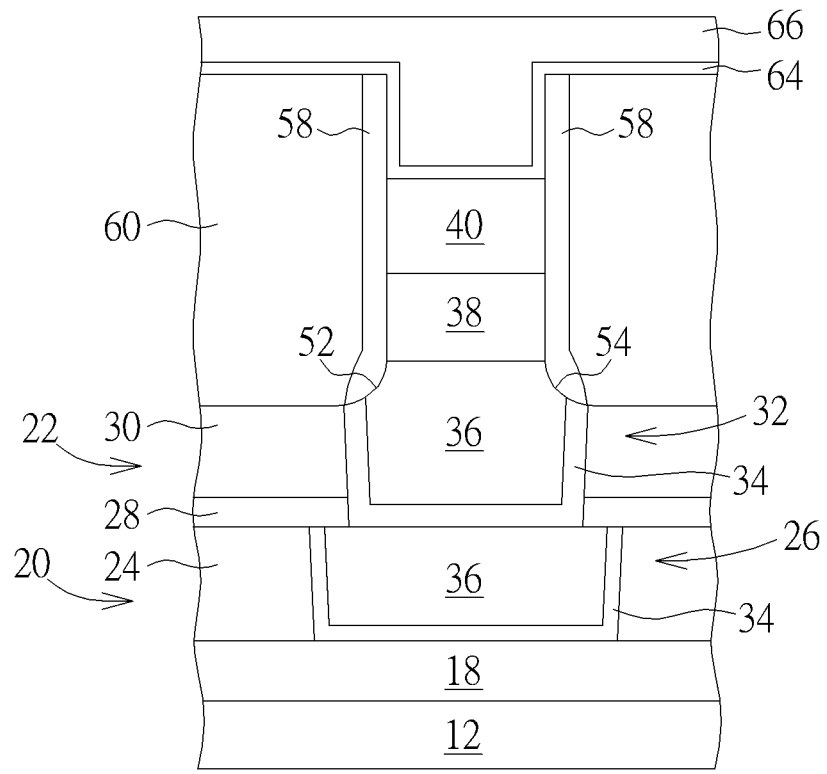

Next, as shown in FIG. 7, a barrier layer 64 and a free layer 66 are formed on the IMD layer 60 and the spacer 58 and filled into the recess 62, in which the barrier layer 64 and the free layer 66 preferably fills the recess 62 completely. In this embodiment, the barrier layer 64 could include oxide containing insulating material such as but not limited to for example aluminum oxide ($AlO_x$) or magnesium oxide (MgO). The free layer 66 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field.

Figure 8:
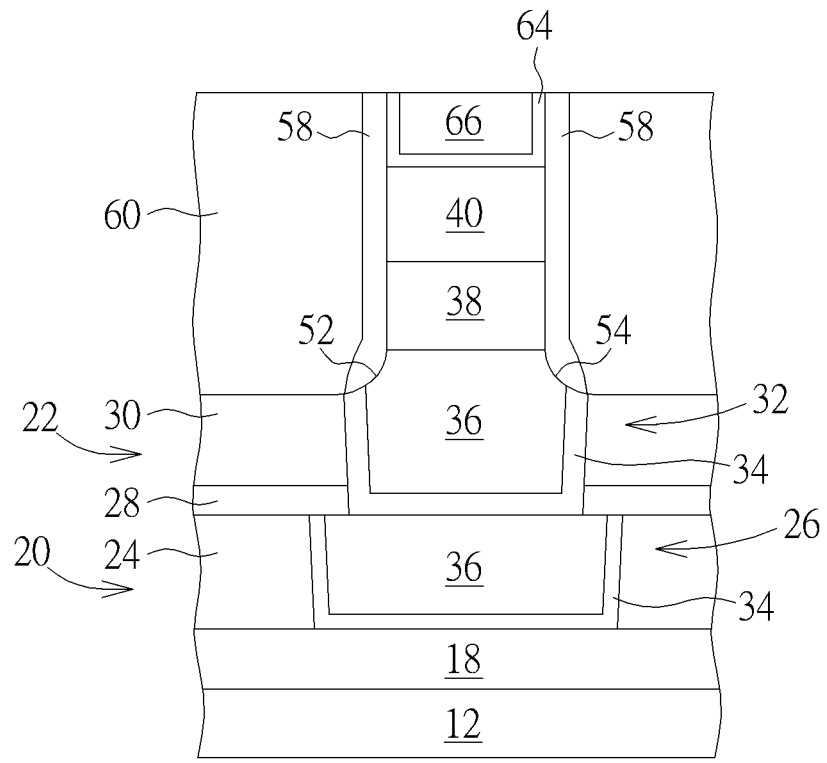

Next, as shown in FIG. 8, another planarizing process such as CMP could be conducted to remove part of the free layer 66 and part of the barrier layer 64 so that the top surface of the free layer 66 and barrier layer 64 is even with the top surface of the spacer 58 and IMD layer 60.

Figure 9:
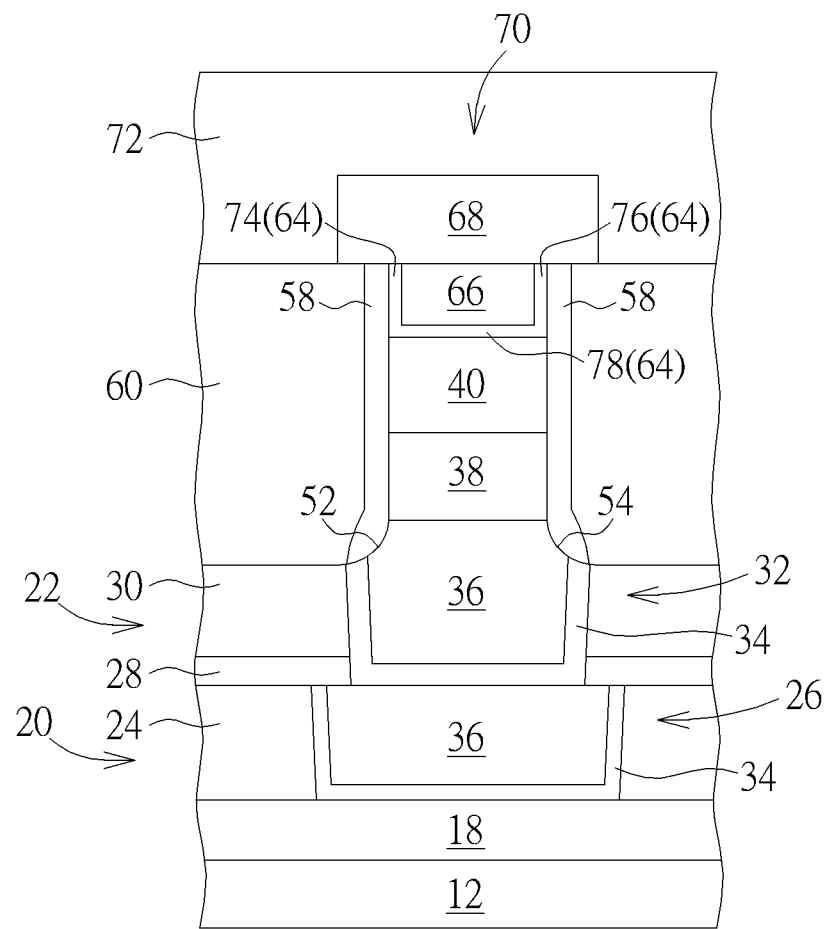

Next, as shown in FIG. 9, a top electrode layer 68 is formed on the IMD layer 60, the barrier layer 64, and the free layer 66, and a photo-etching process is conducted to remove part of the top electrode layer 68 so that the patterned top electrode layer 68 and the free layer 66, barrier layer 64, pinned layer 40, and bottom electrode layer 38 together form another MTJ 70. In this embodiment, the top electrode layer 68 and the bottom electrode layer 38 could be made of same or different conductive materials while the two layers 68 and 38 could all include Ta, Pt, Cu, Au, Al, or combination thereof.

Next, another IMD layer 72 could be formed on the IMD layer 60 to cover the MTJ 70, and another metal interconnection (not shown) could be formed in the IMD layer 72 according to the aforementioned metal interconnective process to electrically connect to the MTJ 70. This completes the fabrication of semiconductor device according to an embodiment of the present invention.

Referring again to FIG. 9, FIG. 9 illustrates a structural view of a semiconductor device according to an embodiment of the present invention. As shown in FIG. 9, the semiconductor device preferably includes an IMD layer 30 disposed on the substrate 12, a metal interconnection 32 disposed in the IMD layer 30, a MTJ 70 disposed on the metal interconnection 32, a spacer 58 surrounding the MTJ 70, and another IMD layer 60 disposed on the IMD layer 30 to surround the spacer 58.

In this embodiment, the MTJ 70 preferably includes a pinned layer 40 disposed on the bottom electrode layer 38, a barrier layer 64 disposed on the pinned layer 40, a free layer 66 disposed on the barrier layer 64, and a top electrode layer 68 disposed on the free layer 66. Preferably, the barrier layer 64 includes a U-shape or U-shaped profile, the top surfaces of the free layer 66, the barrier layer 64, the spacer 58, and the IMD layer 60 are coplanar, and the bottom surface of the top electrode layer 68 not only contacts the free layer 66 and barrier layer 64 directly but also contacts the spacer 58 and the IMD layer 60 directly. Viewing from a more detailed perspective, the barrier layer 64 further includes a first vertical portion 74 and a second vertical portion 76 disposed adjacent to two sides of the free layer 66 and a horizontal portion 78 connecting the first vertical portion 74 and the second vertical portion 76, in which the sidewalls of each of the first vertical portion 74 and the second vertical portion 76 are aligned with edges or sidewalls of the pinned layer 40.

Figure 10:
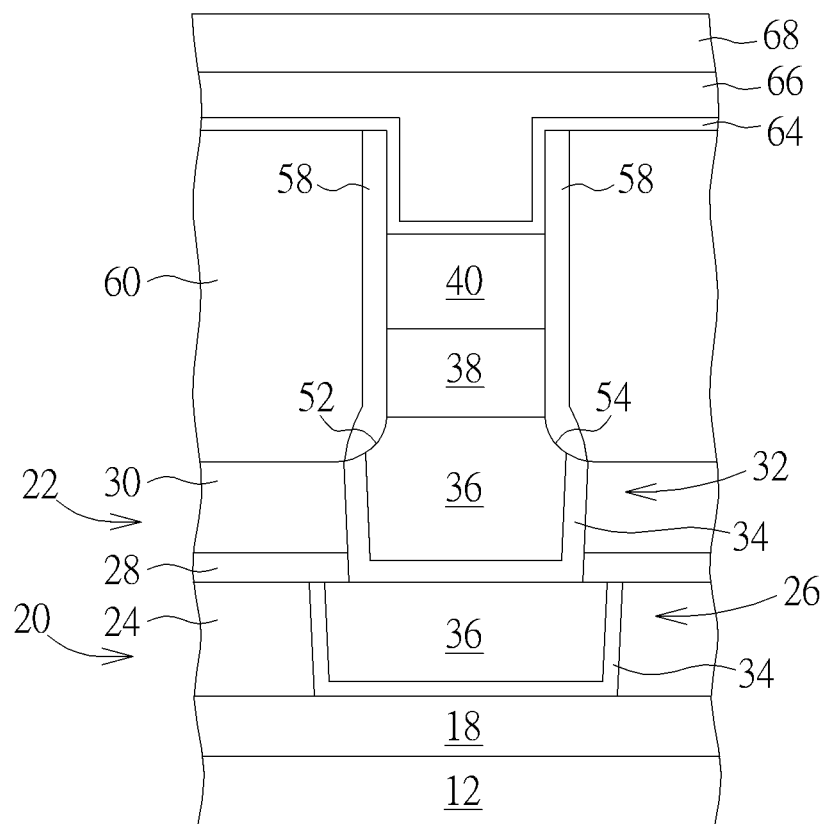
FIGS. 10-11 illustrate a method for fabricating a MRAM device according to an embodiment of the present invention.
Figure 11:
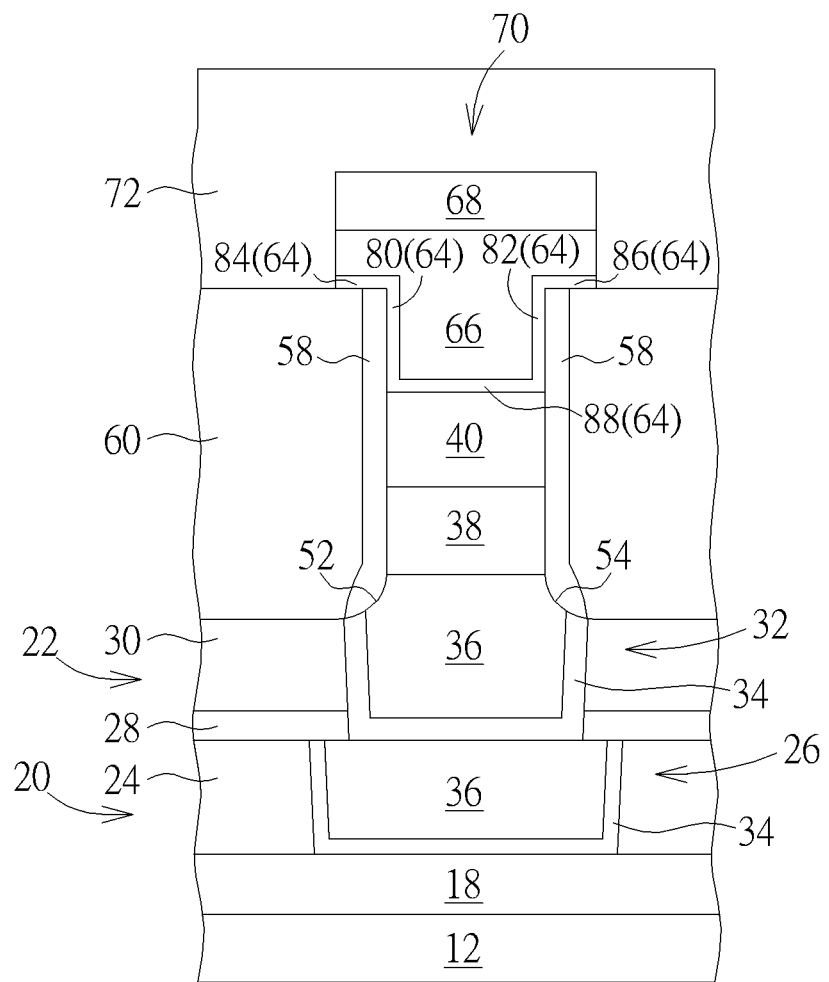

Referring to FIGS. 10-11, FIGS. 10-11 illustrate a method for fabricating a semiconductor device according to an embodiment of the present invention. As shown in FIG. 10, after the sacrificial layer 42 is removed in FIG. 6 to form the recess 62, it would also be desirable to sequentially form a barrier layer 64 and a free layer 66 on the IMD layer 60 and spacer 58 and fill the recess 62 completely, and then form a top electrode layer 68 on the free layer 66 immediately afterwards. Next, as shown in FIG. 11, a photo-etching process is then conducted to pattern the top electrode layer 68, the free layer 66, and the barrier layer 64 to form another MTJ 70. Next, another IMD layer 72 could be formed on the IMD layer 60 to cover the MTJ 70 depending on the demand of the product, and another metal interconnection (not shown) could be formed in the IMD layer 72 according to the aforementioned metal interconnective process to electrically connect to the MTJ 70. This completes the fabrication of semiconductor device according to an embodiment of the present invention.

Referring to FIG. 11, which further illustrates a structural view of a semiconductor device according to an embodiment of the present invention. As shown in FIG. 11, the semiconductor device preferably includes an IMD layer 30 disposed on the substrate 12, a metal interconnection 32 disposed in the IMD layer 30, a MTJ 70 disposed on the metal interconnection 32, a spacer 58 surrounding the MTJ 70, and another IMD layer 60 disposed on the IMD layer 30 to surround the spacer 58.

In this embodiment, the MTJ 70 preferably includes a pinned layer 40 disposed on the bottom electrode layer 38, a barrier layer 64 disposed on the pinned layer 40, a free layer 66 disposed on the barrier layer 64, and a top electrode layer 68 disposed on the free layer 66, in which the barrier layer 64 is extended to contact a top surface of the spacer 58 and a top surface of the IMD layer 60 and the free layer 66 preferably includes a T-shape or T-shaped cross-section. Viewing from a more detailed perspective, the barrier layer 64 further includes a first vertical portion 80 and a second vertical portion 82 disposed adjacent to two sides of the free layer 66, a first horizontal portion 84 connected to the first vertical portion 80, a second horizontal portion 86 connected to the second vertical portion 82, and a third horizontal portion 88 connected to the first vertical portion 80 and the second vertical portion 82. Preferably, each of the first horizontal portion 84 and the second horizontal portion 86 is extended from two sides of the free layer 66 to contact the top surface of the spacer 58 directly, and the sidewalls of the first horizontal portion 84 and second horizontal portion 86 are also aligned with sidewalls of the top electrode layer 68 and free layer 66 on both left and right sides.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a magnetic tunneling junction (MTJ) on a substrate, wherein the MTJ comprises
        a pinned layer on a bottom electrode layer;
        a barrier layer on the pinned layer;
        a free layer on the barrier layer; and
        a top electrode layer on the free layer;
    a spacer around the MTJ and adjacent to sidewalls of the bottom electrode layer, the pinned layer, and the barrier layer, wherein the barrier layer is extended to contact a top surface of the spacer, a sidewall of the barrier layer is aligned with a sidewall of the pinned layer, a thickness of the free layer on the pinned layer is greater than a thickness of the free layer on the spacer, and a width of the free layer is greater than a width of the pinned layer; and
    a second inter-metal dielectric (IMD) layer around the spacer, wherein the barrier layer is extended to contact a top surface of the second IMD layer.

2. The semiconductor device of claim 1, further comprising:
    a first inter-metal dielectric (IMD) layer on the substrate;
    a metal interconnection in the first IMD layer;
    the MTJ on the metal interconnection; and
    the second IMD layer on the first IMD layer and around the spacer.

3. The semiconductor device of claim 1, wherein the free layer comprises a T-shape.

4. The semiconductor device of claim 1, wherein the barrier layer comprises:
    a first vertical portion and a second vertical portion adjacent to two sides of the free layer;
    a first horizontal portion connecting the first vertical portion;
    a second horizontal portion connecting the second vertical portion; and
    a third horizontal portion connecting the first vertical portion and the second vertical portion.

5. The semiconductor device of claim 4, wherein the first horizontal portion and the second horizontal portion are extended to contact the top surface of the spacer.

* * * * *